(12) United States Patent
Sun et al.

(10) Patent No.: US 10,734,202 B2
(45) Date of Patent: Aug. 4, 2020

(54) RARE-EARTH OXIDE BASED EROSION RESISTANT COATINGS FOR SEMICONDUCTOR APPLICATION

(71) Applicant: Applied Materials, Inc., Santa Clara, CA (US)

(72) Inventors: Jennifer Sun, Mountain View, UT (US); Biraja P. Kanungo, San Jose, CA (US); Tom Cho, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/729,950

(22) Filed: Jun. 3, 2015

(65) Prior Publication Data

US 2015/0270108 A1 Sep. 24, 2015

Related U.S. Application Data

(63) Continuation of application No. 13/954,808, filed on Jul. 30, 2013, now Pat. No. 9,865,434.
(Continued)

(51) Int. Cl.
*B32B 1/02* (2006.01)
*B32B 5/00* (2006.01)
(Continued)

(52) U.S. Cl.
CPC ...... *H01J 37/32495* (2013.01); *C04B 41/009* (2013.01); *C04B 41/5045* (2013.01);
(Continued)

(58) Field of Classification Search
CPC . Y10T 428/13; Y10T 428/131; Y10T 428/26; C01F 17/00; H01J 37/32495;
(Continued)

(56) References Cited

U.S. PATENT DOCUMENTS 3,796,182 A    3/1974  Rosier
4,399,199 A    8/1983  McGill et al.
(Continued)

FOREIGN PATENT DOCUMENTS

CA    2297543       9/2000
CN    101772589 A   7/2010
(Continued)

OTHER PUBLICATIONS

Gidrat, et al. "Plasma Spray-CVD: A New Thermal Spray Process to Produce Thin Films from Liquid of Gaseous Precursors", Journal of Thermal Spray Technology, Jun. 2011, pp. 882-887, vol. 20(4).
(Continued)

*Primary Examiner* — Marc A Patterson
(74) *Attorney, Agent, or Firm* — Lowenstein Sandler LLP (57) ABSTRACT

An article includes a body that is coated with a ceramic coating. The ceramic coating may include $Y_2O_3$ in a range between about 45 mol % to about 99 mol %, $ZrO_2$ in a range between about 1 mol % to about 55 mol %, and $Al_2O_3$ in a range between about 1 mol % to about 10 mol %. The ceramic coating may alternatively include $Y_2O_3$ in a range between about 45 mol % to about 99 mol % and $Al_2O_3$ in a range between about 1 mol % to about 10 mol %. The ceramic coating may alternatively include $Y_2O_3$ in a range between about 45 mol % to about 99 mol % and $ZrO_2$ in a range between about 1 mol % to about 55 mol %.

20 Claims, 8 Drawing Sheets

Related U.S. Application Data (60) Provisional application No. 61/831,424, filed on Jun. 5, 2013.

(51) Int. Cl.

| | | |
|---|---|---|
| *H01J 37/32* | (2006.01) | |
| *C23C 16/44* | (2006.01) | |
| *C04B 41/87* | (2006.01) | |
| *C04B 41/00* | (2006.01) | |
| *C04B 41/50* | (2006.01) | |
| *C23C 4/11* | (2016.01) | |
| *C23C 4/134* | (2016.01) | |

(52) U.S. Cl.
CPC ............... *C04B 41/87* (2013.01); *C23C 4/11* (2016.01); *C23C 4/134* (2016.01); *C23C 16/4404* (2013.01); *Y10T 428/131* (2015.01); *Y10T 428/26* (2015.01)

(58) Field of Classification Search
CPC ... C23C 16/4404; C04B 41/5045; B32B 1/02; B32B 5/00
See application file for complete search history.

(56) References Cited

U.S. PATENT DOCUMENTS

| | | | |
|---|---|---|---|
| 4,439,248 A | 3/1984 | Herchenroeder et al. | |
| 4,642,440 A | 2/1987 | Schnackel et al. | |
| 4,704,299 A | 11/1987 | Wielonski et al. | |
| 4,880,614 A | 11/1989 | Strangman et al. | |
| 5,381,944 A | 1/1995 | Makowiecki et al. | |
| 5,415,756 A | 5/1995 | Wolfe et al. | |
| 5,532,190 A | 7/1996 | Goodyear et al. | |
| 5,626,923 A | 5/1997 | Fitzgibbons et al. | |
| 5,631,803 A | 5/1997 | Cameron et al. | |
| 5,687,679 A | 11/1997 | Mullin et al. | |
| 5,766,693 A | 6/1998 | Rao | |
| 5,800,871 A | 9/1998 | Collins et al. | |
| 5,837,058 A | 11/1998 | Chen et al. | |
| 5,853,815 A | 12/1998 | Muehlberger | |
| 5,916,689 A | 6/1999 | Collins et al. | |
| 5,939,219 A | 8/1999 | Jansing et al. | |
| 6,051,279 A | 4/2000 | Gualco et al. | |
| 6,106,959 A | 8/2000 | Vance et al. | |
| 6,194,083 B1 | 2/2001 | Yasuda et al. | |
| 6,245,202 B1 | 6/2001 | Edamura et al. | |
| 6,361,645 B1 | 3/2002 | Schoepp et al. | |
| 6,383,964 B1 | 5/2002 | Nakahara et al. | |
| 6,506,254 B1 | 1/2003 | Bosch et al. | |
| 6,530,990 B2 | 3/2003 | Kong et al. | |
| 6,534,194 B2 | 3/2003 | Weihs et al. | |
| 6,548,424 B2 | 4/2003 | Putkonen | |
| 6,576,354 B2 | 6/2003 | Tsukatani et al. | |
| 6,581,275 B2 | 6/2003 | Narendmath et al. | |
| 6,616,031 B2 | 9/2003 | Wong et al. | |
| 6,645,585 B2 | 11/2003 | Ozono | |
| 6,776,873 B1* | 8/2004 | Sun .................... | C23C 16/4404 118/723 R |
| 6,777,353 B2 | 8/2004 | Putkonen | |
| 6,783,875 B2 | 8/2004 | Yamada et al. | |
| 6,794,059 B2 | 9/2004 | Shanker | |
| 6,805,952 B2 | 10/2004 | Chang et al. | |
| 6,858,332 B2 | 2/2005 | Yamada | |
| 6,858,546 B2 | 2/2005 | Niinisto et al. | |
| 6,933,254 B2 | 8/2005 | Morita et al. | |
| 6,942,929 B2 | 9/2005 | Han et al. | |
| 6,983,892 B2 | 1/2006 | Noorbakhsh et al. | |
| 7,101,819 B2 | 9/2006 | Rosenflanz et al. | |
| 7,226,673 B2 | 6/2007 | Yamada et al. | |
| 7,300,537 B2 | 11/2007 | O'Donnell et al. | |
| 7,351,482 B2 | 4/2008 | Boutwell et al. | |
| 7,351,658 B2 | 4/2008 | Putkonen | |
| 7,441,688 B2 | 10/2008 | Van Heerden et al. | |
| 7,498,272 B2 | 3/2009 | Niinisto et al. | |
| 7,507,268 B2 | 3/2009 | Rosenflanz | |
| 7,510,585 B2 | 3/2009 | Rosenflanz | |
| 7,510,641 B2 | 3/2009 | Kreiskott et al. | |
| 7,615,133 B2 | 11/2009 | Tateno et al. | |
| 7,648,782 B2 | 1/2010 | Kobayashi et al. | |
| 7,649,729 B2 | 1/2010 | Buchberger, Jr. et al. | |
| 7,690,308 B2 | 4/2010 | Nielson et al. | |
| 7,696,117 B2 | 4/2010 | Sun et al. | |
| 7,776,774 B2 | 8/2010 | Kobayashi et al. | |
| 7,810,704 B2 | 10/2010 | Duckham et al. | |
| 7,964,517 B2 | 6/2011 | Jaiswal | |
| 8,034,734 B2 | 10/2011 | Sun et al | |
| 8,206,829 B2 | 6/2012 | Sun et al. | |
| 8,367,227 B2 | 2/2013 | Sun et al. | |
| 8,404,572 B2 | 3/2013 | Chang et al. | |
| 8,829,079 B2 | 9/2014 | Shultz et al. | |
| 9,020,836 B2 | 4/2015 | Fisher et al. | |
| 9,394,615 B2* | 7/2016 | Sun .................... | C23F 1/08 |
| 9,865,434 B2* | 1/2018 | Sun .................... | C23C 16/4404 |
| 2001/0003271 A1* | 6/2001 | Otsuki ............... | C23C 16/4404 118/723 I |
| 2002/0009560 A1 | 1/2002 | Ozono | |
| 2002/0018921 A1 | 2/2002 | Yamada et al. | |
| 2002/0086119 A1 | 7/2002 | Hariharan et al. | |
| 2002/0100424 A1 | 8/2002 | Sun et al. | |
| 2003/0007308 A1 | 1/2003 | Harada et al. | |
| 2003/0010353 A1 | 1/2003 | Kawasaki et al. | |
| 2003/0047802 A1 | 3/2003 | Hiramatsu et al. | |
| 2003/0059653 A1 | 3/2003 | Yamada et al. | |
| 2003/0091835 A1 | 5/2003 | Takahashi et al. | |
| 2003/0110708 A1 | 6/2003 | Rosenflanz | |
| 2003/0159657 A1 | 8/2003 | Kaushal et al. | |
| 2003/0185965 A1 | 10/2003 | Lin et al. | |
| 2003/0232139 A1 | 12/2003 | DeTura | |
| 2004/0002221 A1* | 1/2004 | O'Donnell ......... | C23C 16/4404 438/710 |
| 2004/0009297 A1 | 1/2004 | Fusaro, Jr. et al. | |
| 2004/0033385 A1 | 2/2004 | Kaushal et al. | |
| 2004/0110016 A1 | 6/2004 | Hamaya et al. | |
| 2004/0229078 A1 | 11/2004 | Maeda | |
| 2004/0266216 A1 | 12/2004 | Li et al. | |
| 2005/0037193 A1 | 2/2005 | Sun et al. | |
| 2005/0042876 A1 | 2/2005 | Kobayashi et al. | |
| 2005/0056056 A1 | 3/2005 | Wong | |
| 2005/0084654 A1 | 4/2005 | Takahashi et al. | |
| 2005/0136188 A1* | 6/2005 | Chang ................ | C04B 41/009 427/421.1 |
| 2005/0153069 A1 | 7/2005 | Tapphorn et al. | |
| 2005/0167409 A1 | 8/2005 | Knorr et al. | |
| 2005/0199183 A1* | 9/2005 | Arai .................... | C23C 16/4404 118/715 |
| 2005/0227118 A1 | 10/2005 | Uchimaru et al. | |
| 2005/0241148 A1 | 11/2005 | Vance | |
| 2005/0266682 A1 | 12/2005 | Chen et al. | |
| 2005/0271984 A1 | 12/2005 | Brueckner et al. | |
| 2005/0282034 A1 | 12/2005 | Hayasaki et al. | |
| 2006/0068189 A1 | 3/2006 | Raybould et al. | |
| 2006/0096703 A1 | 5/2006 | Moriya et al. | |
| 2006/0164785 A1 | 7/2006 | Pellegrin | |
| 2006/0222777 A1 | 10/2006 | Skoog et al. | |
| 2007/0006561 A1 | 1/2007 | Brady et al. | |
| 2007/0026246 A1* | 2/2007 | Harada ............... | C23C 4/10 428/469 |
| 2007/0110915 A1 | 5/2007 | Kitamura et al. | |
| 2007/0169891 A1 | 7/2007 | Koshiishi et al. | |
| 2007/0212567 A1 | 9/2007 | Esaki et al. | |
| 2007/0218302 A1 | 9/2007 | Kobayashi et al. | |
| 2008/0016684 A1 | 1/2008 | Olechnowicz et al. | |
| 2008/0029032 A1* | 2/2008 | Sun et al. .......... | 118/728 |
| 2008/0090034 A1 | 4/2008 | Harrison et al. | |
| 2008/0099148 A1 | 5/2008 | Ryabova et al. | |
| 2008/0108225 A1 | 5/2008 | Sun et al. | |
| 2008/0113218 A1 | 5/2008 | Schlichting et al. | |
| 2008/0145674 A1* | 6/2008 | Darolia .............. | F01D 5/288 428/433 |
| 2008/0151467 A1 | 6/2008 | Simpson | |
| 2008/0169588 A1 | 7/2008 | Shih et al. | |
| 2008/0174930 A1 | 7/2008 | Hattori et al. | |
| 2008/0213496 A1 | 9/2008 | Sun et al. | |

(56) References Cited

U.S. PATENT DOCUMENTS

| | | |
|---|---|---|
| 2008/0223725 A1 | 9/2008 | Han et al. |
| 2008/0241412 A1 | 10/2008 | Inaki et al. |
| 2008/0264564 A1 | 10/2008 | Sun et al. |
| 2008/0264565 A1 | 10/2008 | Sun et al. |
| 2008/0268171 A1 | 10/2008 | Ma et al. |
| 2008/0268645 A1 | 10/2008 | Kao et al. |
| 2009/0034147 A1 | 2/2009 | Narendmath et al. |
| 2009/0034148 A1 | 2/2009 | Lubomirsky et al. |
| 2009/0034149 A1 | 2/2009 | Lubomirsky et al. |
| 2009/0036292 A1 | 2/2009 | Sun et al. |
| 2009/0075486 A1 | 3/2009 | Kikuyama et al. |
| 2009/0133713 A1 | 5/2009 | Ohmi et al. |
| 2009/0214825 A1* | 8/2009 | Sun .................. C23C 4/11 428/141 |
| 2009/0252945 A1 | 10/2009 | Refke et al. |
| 2009/0284894 A1 | 11/2009 | Cooke |
| 2009/0297718 A1 | 12/2009 | Sarrafi-Nour et al. |
| 2010/0048379 A1 | 2/2010 | Thippareddy et al. |
| 2010/0053841 A1 | 3/2010 | Rusinko, Jr. et al. |
| 2010/0112192 A1 | 5/2010 | Li et al. |
| 2010/0115961 A1 | 5/2010 | Chapman et al. |
| 2010/0119843 A1 | 5/2010 | Sun et al. |
| 2010/0129670 A1* | 5/2010 | Sun .................. C04B 41/4539 428/432 |
| 2010/0160143 A1* | 6/2010 | Sun .................. H01J 37/32467 501/103 |
| 2010/0177454 A1 | 7/2010 | Elliot et al. |
| 2010/0196481 A1 | 8/2010 | Pritchard et al. |
| 2010/0218472 A1 | 9/2010 | Iyer |
| 2010/0272982 A1 | 10/2010 | Dickinson et al. |
| 2010/0314356 A1 | 12/2010 | Nagayama et al. |
| 2011/0036967 A1 | 2/2011 | Long et al. |
| 2011/0049729 A1 | 3/2011 | Naundorf et al. |
| 2011/0081782 A1 | 4/2011 | Liang et al. |
| 2011/0086178 A1 | 4/2011 | Ruud et al. |
| 2011/0149462 A1 | 6/2011 | Kugimoto et al. |
| 2011/0151237 A1 | 6/2011 | Nakano et al. |
| 2011/0174441 A1 | 7/2011 | Yamashita et al. |
| 2011/0198034 A1 | 8/2011 | Sun et al. |
| 2011/0268877 A1 | 11/2011 | Dickson et al. |
| 2011/0268956 A1 | 11/2011 | Fagoaga Altuna et al. |
| 2011/0315081 A1 | 12/2011 | Law et al. |
| 2012/0034469 A1* | 2/2012 | Sun .................. H01J 37/32467 428/426 |
| 2012/0035046 A1 | 2/2012 | Rosenflanz |
| 2012/0040100 A1 | 2/2012 | Matias et al. |
| 2012/0076574 A1 | 3/2012 | Parkhe |
| 2012/0100299 A1 | 4/2012 | Zajchowski et al. |
| 2012/0100300 A1 | 4/2012 | Gindrat et al. |
| 2012/0104703 A1 | 5/2012 | Sun et al. |
| 2012/0125488 A1 | 5/2012 | Sun et al. |
| 2012/0141661 A1 | 6/2012 | Cho et al. |
| 2012/0299253 A1 | 11/2012 | Kosakai et al. |
| 2012/0307412 A1 | 12/2012 | Boyd, Jr. et al. |
| 2013/0019797 A1 | 1/2013 | Tanaka et al. |
| 2013/0023401 A1 | 1/2013 | Watanabe et al. |
| 2013/0026720 A1 | 1/2013 | Hori et al. |
| 2013/0095340 A1 | 4/2013 | Sivakumar et al. |
| 2013/0174983 A1 | 7/2013 | Kikuchi et al. |
| 2013/0216783 A1 | 8/2013 | Duan et al. |
| 2013/0216821 A1 | 8/2013 | Sun et al. |
| 2013/0224675 A1 | 8/2013 | Park |
| 2013/0273313 A1 | 10/2013 | Sun et al. |
| 2013/0273327 A1 | 10/2013 | Sun et al. |
| 2013/0284373 A1 | 10/2013 | Sun et al. |
| 2013/0288037 A1 | 10/2013 | Sun et al. |
| 2014/0030486 A1 | 1/2014 | Sun et al. |
| 2014/0030533 A1 | 1/2014 | Sun et al. |

FOREIGN PATENT DOCUMENTS

| | | |
|---|---|---|
| DE | 10224137 A1 | 12/2003 |
| EP | 330196 B1 | 8/1989 |
| JP | H5238855 A | 9/1993 |
| JP | 2000001362 | 1/2000 |
| JP | 2001102365 A | 4/2001 |
| JP | 2001181042 | 7/2001 |
| JP | 2001226773 | 8/2001 |
| JP | 2002001865 A | 1/2002 |
| JP | 2002-087878 A | 3/2002 |
| JP | 2003146751 A | 5/2003 |
| JP | 2003212598 A | 7/2003 |
| JP | 2003238250 A | 8/2003 |
| JP | 2005206402 A | 8/2005 |
| JP | 2005-279481 A | 10/2005 |
| JP | 2005529833 A | 10/2005 |
| JP | 2006-027012 A | 8/2006 |
| JP | 2006-207012 A | 8/2006 |
| JP | 2006199545 A | 8/2006 |
| JP | 2007-191794 A | 8/2007 |
| JP | 2007217779 | 8/2007 |
| JP | 2009068066 | 4/2009 |
| JP | 2009-536732 A | 10/2009 |
| JP | 2010-106327 A | 5/2010 |
| JP | 2010-229492 A | 10/2010 |
| JP | 2013-124378 A | 6/2013 |
| JP | 2017100938 | 6/2017 |
| KR | 10-2003-0025007 | 3/2003 |
| KR | 10-2007-0013118 | 1/2007 |
| KR | 2008-0096340 | 10/2008 |
| KR | 10-2010-005250 A | 5/2010 |
| KR | 2010-0052502 | 5/2010 |
| KR | 10-2011-0028378 | 3/2011 |
| KR | 10-2011-0117845 | 10/2011 |
| KR | 20110117845 A | 10/2011 |
| KR | 101094725 B1 * | 12/2011 |
| KR | 10-118692 B1 | 1/2012 |
| KR | 10-1108692 B1 | 1/2012 |
| WO | 2001024581 A1 | 4/2001 |
| WO | 2002/000968 | 1/2002 |
| WO | 2003/003404 | 1/2003 |
| WO | 2003/100843 | 12/2003 |
| WO | 2009/108275 | 9/2009 |
| WO | 2012/033326 A2 | 3/2012 |
| WO | 2013/126466 A1 | 8/2013 |
| WO | 2013/155220 A1 | 10/2013 |
| WO | 2013/162909 A1 | 10/2013 |
| WO | 2014/018830 A1 | 1/2014 |
| WO | 2014/018835 A1 | 1/2014 |
| WO | 2014/197203 | 12/2014 |

OTHER PUBLICATIONS

Sulzer Metco, "Solutions Flash, ChamPro™ LPPS™ Hybrid Technologies for Application of Unique, High-Performance Functional Surfaces", Jul. 2012, SF-0014.1, 12 pages.

International Search Report & Written Opinion dated Sep. 23, 2014 in International Application No. PCT/US2014/038858.

Refke, et al "LPPS thin film technology for the application of TBC systems", International Thermal Spray Conference, Basel Switzerland, May 2-4, 2005, 6 pages.

Taffner et al., "Preparation and Microstructural Analysis of High-Performance Ceramics," ASM Handbook vol. 9: Metallography and Microstructures, 2004, 11 pages, ASM International, Materials Park, Ohio, USA.

Bhatia et al., "Mechanisms of ceramic coating deposition in solution-precurosr plasma spray," J.Mater. Res., vol. 17, No. 9, Sep. 2002, 10 pages, Materials Research Society, Warrendale, PA, USA.

Haas et al., "Gas jet assisted vapor deposition of yttria stabilized zirconia," Department of Materials Science and Engineering, School of Engineering and Applied Science, published Feb. 27, 2009 University of Virginia, Charlottesville, Virginia 22903.

Di Girolamo et al., "Microstructure and thermal properties of plasma-sprayed ceramic thermal barrier coatings," Energia, Ambiente e Innovazione, Published Jan. 2, 2013.

Bergant et al., "Porosity evaluation of flame-sprayed and heat-treated coatings using image analysis," Image Anal Stereol 2011;30:53-62, Published Jan. 27, 2011.

Smith et al., "Very Low Pressure Plasma Spray—A Review of an Emerging Technology in the Thermal Spray Community," Coatings (56) References Cited

OTHER PUBLICATIONS 2011, 1, 117-132, doi: 10.3390/coatings1020117, Published Dec. 20, 2011.

Zircotec—Plasma sprayed ceramic thermal coatings, http://www.zircotec.com/page/plasma-spray-processing/39, downloaded Apr. 4, 2014.

Nakamura et al., "Effects of Pores on Mechanical Properties of Plasma-Sprayed Ceramic Coatings," J. Am. Ceram. Soc., 83 [3] 578-84, Mar. 2000.

Govindarajan et al., "In situ Particle Generation and Splat Formation During Solution Precursor Plasma Spraying of Yttria-Stabilized Zirconia Coatings," J Am. Ceram. Soc., 1-9 (2011).

"Thermal Spraying," defination, Wikipedia, http://en.wikipedia.org/wiki/Thermal_spraying, downloaded Apr. 14, 2014.

Kitamura et al., "Structural, Mechanical and Erosion Properties of Yttrium Oxide Coatings by Axial Suspension Plasma Spraying for Electronics Applications," Journal of Thermal Spray Technology, 20:170-185, Jan. 2011.

* cited by examiner

RARE-EARTH OXIDE BASED EROSION RESISTANT COATINGS FOR SEMICONDUCTOR APPLICATION

PRIORITY CLAIM

This application is a continuation of Ser. No. 13/954,808, filed Jul. 30, 2013, which claims the benefit of U.S. Provisional Application Ser. No. 61/831,424 filed on Jun. 5, 2013, both of which are hereby incorporated by reference.

TECHNICAL FIELD

Embodiments of the present invention relate, in general, to ceramic coated articles and to a process for applying a ceramic coating to a substrate.

BACKGROUND

In the semiconductor industry, devices are fabricated by a number of manufacturing processes producing structures of an ever-decreasing size. Some manufacturing processes, such as plasma etch and plasma clean processes, expose a substrate to a high-speed stream of plasma to etch or clean the substrate. The plasma may be highly corrosive, and may corrode processing chambers and other surfaces that are exposed to the plasma. This corrosion may generate particles, which frequently contaminate the substrate that is being processed, contributing to device defects.

As device geometries shrink, susceptibility to defects increases, and particle contaminant requirements (i.e., on-wafer performance) become more stringent. To minimize particle contamination introduced by plasma etch and/or plasma clean processes, chamber materials have been developed that are resistant to plasmas. Examples of such plasma resistant materials include ceramics composed of $Al_2O_3$, AlN, SiC, $Y_2O_3$, quartz, and ZrO2. Different ceramics provide different material properties, such as plasma resistance, rigidity, flexural strength, thermal shock resistance, and so on. Also, different ceramics have different material costs. Accordingly, some ceramics have superior plasma resistance, other ceramics have lower costs, and still other ceramics have superior flexural strength and/or thermal shock resistance.

SUMMARY

In embodiments, an article includes a body that is coated with a ceramic coating. In one embodiment, the ceramic coating includes $Y_2O_3$ in a range between about 45 mol % to about 99 mol %, $ZrO_2$ in a range between about 1 mol % to about 55 mol %, and $Al_2O_3$ in a range between about 1 mol % to about 10 mol %. In another embodiment, the ceramic coating includes $Y_2O_3$ in a range between about 45 mol % to about 99 mol % and $Al_2O_3$ in a range between about 1 mol % to about 10 mol %. In another embodiment, the ceramic coating includes $Y_2O_3$ in a range between about 45 mol % to about 99 mol % and $ZrO_2$ in a range between about 1 mol % to about 55 mol %.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments of the invention are directed to a process for coating a substrate or body with a ceramic coating, and to an article (e.g., a lid for a plasma etch reactor, a showerhead, a chamber liner, etc.) created using such a coating process. In one embodiment, an article includes a body coated with a ceramic coating including molar concentrations of $Y_2O_3$ in a range between about 45 mol % to about 100 mol %, $ZrO_2$ in a range between about 0 mol % to about 55 mol %, and $Al_2O_3$ in a range between about 0 mol % to about 10 mol %. In one embodiment, an article includes a body coated with a ceramic coating including $Y_2O_3$ in a range between about 30 mol % to about 60 mol %, $ZrO_2$ in a range between about 0 mol % to about 20 mol %, and $Al_2O_3$ in a range between about 30 mol % to about 60 mol %. In one example, the coating can have a thickness between about 5 mil and about 25 mil.

The body for the article can include a metal such as aluminum, copper, or magnesium, to name a few examples. Alternatively, the body for the article may include a ceramic such as $Al_2O_3$, AlN, and so forth. Prior to coating, a surface of the article can be roughened to a roughness between about 100 micro-inches and about 300 micro-inches, and/or heated to a temperature of about 70 degrees Celsius to about 200 degrees Celsius in some embodiments.

The ceramic coating of the article may be highly resistant to plasma etching, and the article may have superior mechanical properties such as a high flexural strength and/or a high thermal shock resistance. For example, $Al_2O_3$ has a high thermo-mechanical strength, but also has relatively high aluminum contamination levels and a low plasma resistance. In contrast, $Y_2O_3$ containing ceramics have enhanced plasma resistance and a low on-wafer level aluminum contamination, but have a relatively low thermo-mechanical strength. Accordingly, the article may have the advantageous properties of a first ceramic substance (e.g., $Al_2O_3$) and the advantageous properties of a second ceramic substance (e.g., a $Y_2O_3$ containing ceramic), without the weaknesses of either ceramic substance.

Performance properties of the coated ceramic article may include a relatively high thermal capability (e.g., ability to withstand operating temperatures of up to approximately 150° C.), a relatively long lifespan (e.g., over approximately 2 years when used in a plasma environment), low on-wafer particle and metal contamination, and a stable electrostatic chuck (ESC) leakage current performance (e.g., when the article is an ESC).

For example, conductor lids are components used in semiconductor manufacturing for high temperature applications where forming the lids of $Al_2O_3$ provides high thermal conductivity and flexural strength. However, under fluorine chemistry, exposed $Al_2O_3$ forms AlF particles as well as Al metal contamination on-wafer. A ceramic coating according to one embodiment on the plasma facing side of the lid can significantly reduce erosion and reduce Al metal contamination.

In another example, dielectric showerheads for use in semiconductor manufacturing chambers can be formed of an anodized Al base bonded to a SiC faceplate. The SiC faceplate could have a high erosion rate affecting wafer etch uniformity. Further, the bonding of the faceplate to the anodized Al base could be damaged due to plasma exposure, such that the faceplate is non-uniformly bonded to the anodized Al base reducing the thermal uniformity of the showerhead. A ceramic coating according to one embodiment can be applied directly over bare Al base to improve bonding and erosion difficulties.

In another example, semiconductor manufacturing chamber liners (e.g., chamber liner kits) can be formed of an Al substrate coated with a ceramic coating according to one embodiment on a plasma-exposed side and anodized Al on a non-plasma exposed side. As a result, the ceramic coating can improve on-wafer performance as well as widen the cleaning window based on the coating porosity level.

When the terms "about" and "approximately" are used herein, these are intended to mean that the nominal value presented is precise within ±10%. Note also that some embodiments are described herein with reference to conductor lids, dielectric showerheads, and chamber liners used in plasma etchers for semiconductor manufacturing. However, it should be understood that such plasma etchers may also be used to manufacture micro-electro-mechanical systems (MEMS)) devices. Additionally, the ceramic articles described herein may be other structures that are exposed to plasma. For example, the ceramic articles may be ceramic rings, walls, bases, gas distribution plates, shower heads, substrate holding frames, etc. of a plasma etcher, a plasma cleaner, a plasma propulsion system, and so forth.

Moreover, embodiments are described herein with reference to articles that cause reduced particle contamination when used in a process chamber for plasma rich processes. However, it should be understood that the articles discussed herein may also provide reduced particle defects and metal contamination when used in process chambers for other processes such as plasma enhanced chemical vapor deposition (PECVD) chambers, plasma enhanced physical vapor deposition (PEPVD) chambers and plasma enhanced atomic layer deposition (PEALD) chambers, as well as non-plasma etchers, non-plasma cleaners, chemical vapor deposition (CVD) furnaces, physical vapor deposition (PVD) furnaces, and so forth.

Figure 1:
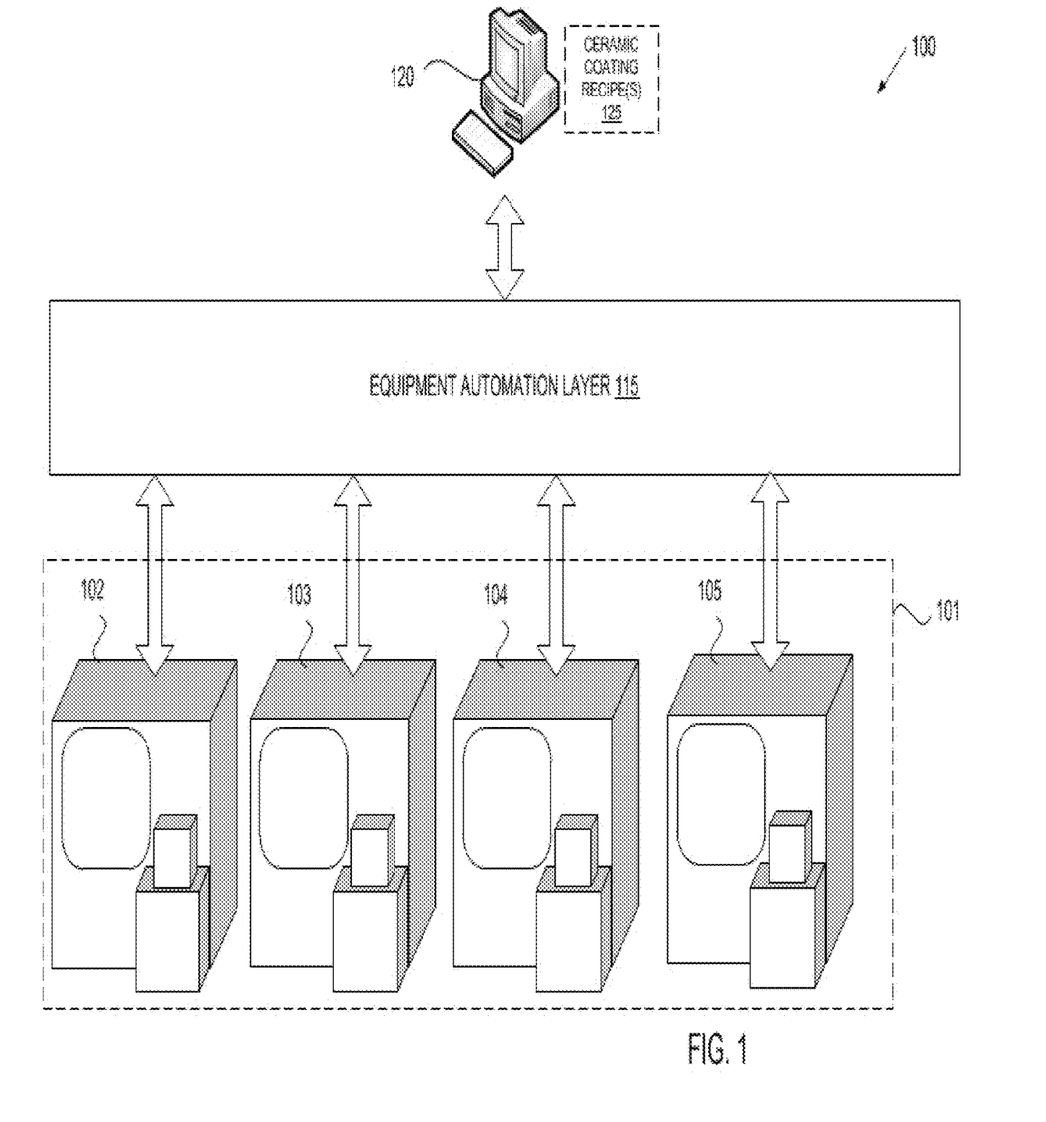
FIG. 1 illustrates an exemplary architecture of a manufacturing system, in accordance with one embodiment of the present invention.

FIG. 1 illustrates an exemplary architecture of a manufacturing system 100, in accordance with embodiments of the present invention. The manufacturing system 100 may be a ceramics manufacturing system. In one embodiment, the manufacturing system 100 includes processing equipment 101 connected to an equipment automation layer 115. The processing equipment 101 may include a bead blaster 102, one or more wet cleaners 103, a ceramic coater 104 and/or one or more grinders 105. The manufacturing system 100 may further include one or more computing device 120 connected to the equipment automation layer 115. In alternative embodiments, the manufacturing system 100 may include more or fewer components. For example, the manufacturing system 100 may include manually operated (e.g., off-line) processing equipment 101 without the equipment automation layer 115 or the computing device 120.

Bead blaster 102 is a machine configured to roughen the surface of articles such as components for use in semiconductor manufacturing chambers. Bead blaster 102 may be a bead blasting cabinet, a hand held bead blaster, or other type of bead blaster. Bead blaster 102 may roughen an article by bombarding the article with beads or particles. In one embodiment, bead blaster 102 fires ceramic beads or particles at the article. The roughness achieved by the bead blaster 102 may be based on a force used to fire the beads, bead materials, bead sizes and/or processing duration. In one embodiment, the bead blaster uses a range of bead sizes to roughen the article.

In alternative embodiments, other types of surface rougheners than a bead blaster 102 may be used. For example, a motorized abrasive pad may be used to roughen the surface of articles. A sander may rotate or vibrate the abrasive pad while the abrasive pad is pressed against a surface of the article. A roughness achieved by the abrasive pad may depend on an applied pressure, on a vibration or rotation rate and/or on a roughness of the abrasive pad.

Wet cleaners 103 are cleaning apparatuses that clean articles (e.g., articles used for semiconductor manufacturing) using a wet clean process. Wet cleaners 103 include wet baths filled with liquids, in which the article is immersed to clean the article. Wet cleaners 103 may agitate the wet bath using ultrasonic waves during cleaning to improve a cleaning efficacy. This is referred to herein as sonicating the wet bath.

In one embodiment, wet cleaners 103 include a first wet cleaner that cleans the articles using a bath of de-ionized (DI) water and a second wet cleaner that cleans the articles using a bath of acetone. Both wet cleaners 103 may sonicate the baths during cleaning processes. The wet cleaners 103 may clean the article at multiple stages during processing. For example, wet cleaners 103 may clean an article after the article has been roughened, after a ceramic coating has been applied to the article, after the article has been used in processing, and so forth.

In other embodiments, alternative types of cleaners such as dry cleaners may be used to clean the articles. Dry cleaners may clean articles by applying heat, by applying gas, by applying plasma, and so forth.

Ceramic coater 104 is a machine configured to apply a ceramic coating to the surface of a substrate or article for use in semiconductor manufacturing. In one embodiment, ceramic coater 104 is a plasma sprayer that plasma sprays a ceramic coating onto the article.

In alternative embodiments, the ceramic coater 104 may apply other thermal spraying techniques such as detonation spraying, wire arc spraying, high velocity oxygen fuel (HVOF) spraying, flame spraying, warm spraying and cold spraying may be used. Additionally, ceramic coater 104 may perform other coating processes such as aerosol deposition, electroplating, physical vapor deposition (PVD), ion assisted deposition (IAD) and chemical vapor deposition (CVD) may be used to form the ceramic coating.

Grinders 105 are machines having an abrasive disk that grinds and/or polishes a surface of the article. The grinders 105 may include a polishing/grinding system such as a rough lapping station, a chemical mechanical planarization (CMP) device, and so forth. The grinders 105 may include a plate that holds an article and an abrasive disk or polishing pad that is pressed against the article while being rotated. These grinders 105 grind a surface of the ceramic coating to decrease a roughness of the ceramic coating and/or to reduce a thickness of the ceramic coating. The grinders 105 may grind/polish the ceramic coating in multiple steps, where each step uses an abrasive pad with a slightly different roughness and/or a different slurry (e.g., if CMP is used). For example, a first abrasive pad with a high roughness may be used to quickly grind down the ceramic coating to a desired thickness, and a second abrasive pad with a low roughness may be used to polish the ceramic coating to a desired roughness. In an example, a thickness of the ceramic coating on a liner kit can be about 8-12 mil with a coating roughness of about 180-250 μin. In another example, a thickness of the ceramic coating on a lid can be about 8-10 mil with a coating roughness of about 6-12 μin. In yet another embodiment, a thickness of the ceramic coating is about 25 mil for a showerhead with a coating roughness of about 180-250 μin. In one embodiment, the ceramic coating has a post-polished thickness of about 8-12 mil (thousandth of an inch) and a post polished roughness of about 6-12 μin.

The grinders 105 may additionally include an angle grinder that grinds the ceramic coating at an angle. The angle grinder has an abrasive disk or pad that is held at an angle to the article. The angle grinder can trim the ceramic coating, and generate chamfers, rounded edges or other sloped transitions between a ceramic coating and an article.

The equipment automation layer 115 may interconnect some or all of the manufacturing machines 101 with computing devices 120, with other manufacturing machines, with metrology tools and/or other devices. The equipment automation layer 115 may include a network (e.g., a location area network (LAN)), routers, gateways, servers, data stores, and so on. Manufacturing machines 101 may connect to the equipment automation layer 115 via a SEMI Equipment Communications Standard/Generic Equipment Model (SECS/GEM) interface, via an Ethernet interface, and/or via other interfaces. In one embodiment, the equipment automation layer 115 enables process data (e.g., data collected by manufacturing machines 101 during a process run) to be stored in a data store (not shown). In an alternative embodiment, the computing device 120 connects directly to one or more of the manufacturing machines 101.

In one embodiment, some or all manufacturing machines 101 include a programmable controller that can load, store and execute process recipes. The programmable controller may control temperature settings, gas and/or vacuum settings, time settings, etc. of manufacturing machines 101. The programmable controller may include a main memory (e.g., read-only memory (ROM), flash memory, dynamic random access memory (DRAM), static random access memory (SRAM), etc.), and/or a secondary memory (e.g., a data storage device such as a disk drive). The main memory and/or secondary memory may store instructions for performing heat treatment processes described herein.

The programmable controller may also include a processing device coupled to the main memory and/or secondary memory (e.g., via a bus) to execute the instructions. The processing device may be a general-purpose processing device such as a microprocessor, central processing unit, or the like. The processing device may also be a special-purpose processing device such as an application specific integrated circuit (ASIC), a field programmable gate array (FPGA), a digital signal processor (DSP), network processor, or the like. In one embodiment, programmable controller is a programmable logic controller (PLC).

In one embodiment, the manufacturing machines 101 are programmed to execute recipes that will cause the manufacturing machines to roughen an article, coat an article and/or machine (e.g., grind or polish) an article. In one embodiment, the manufacturing machines 101 are programmed to execute recipes that perform operations of a multi-step process for manufacturing a ceramic coated article, as described with reference to FIG. 2.

Figure 2:
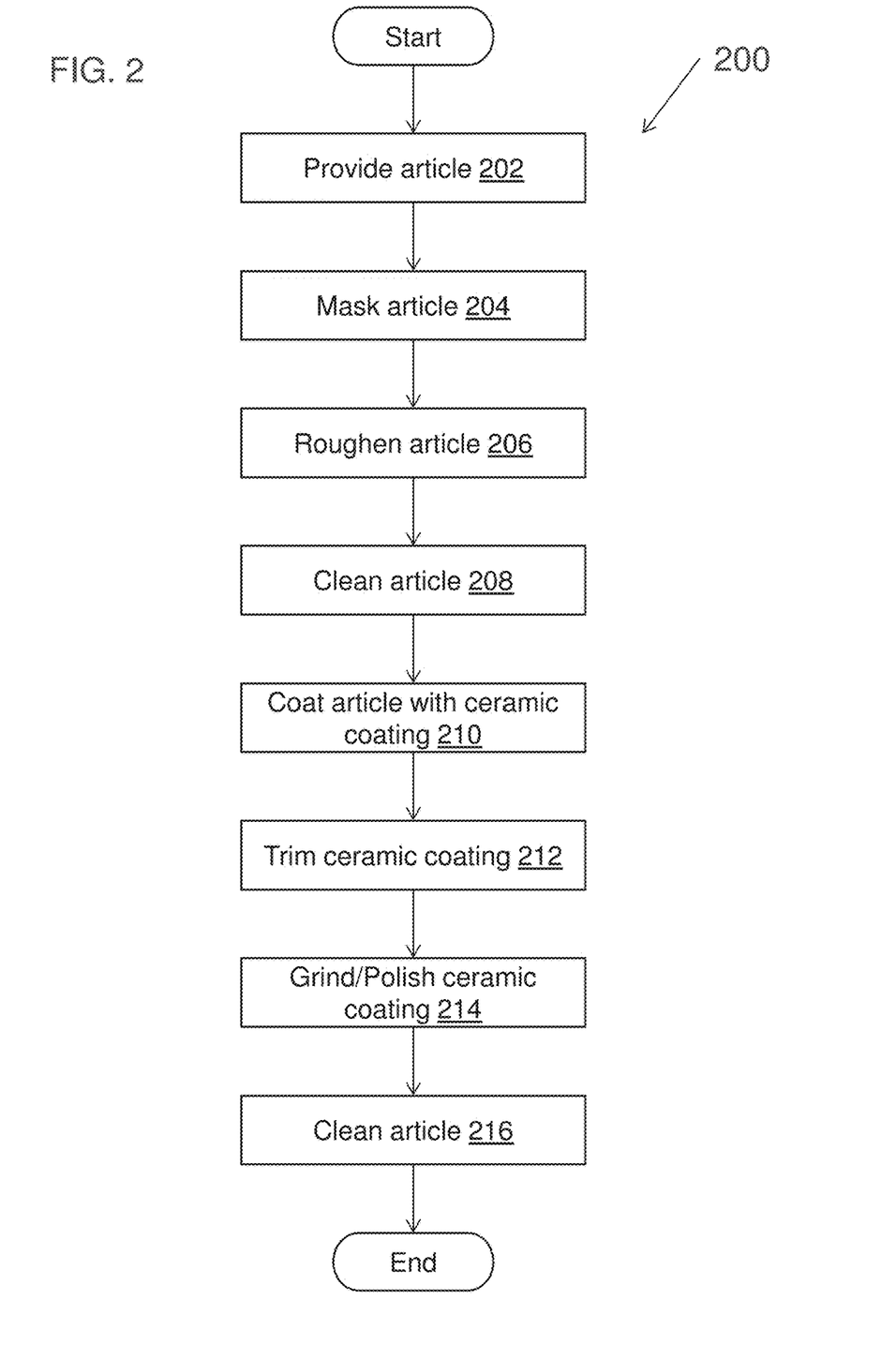
FIG. 2 is a flow chart showing a process for manufacturing an article with a ceramic coating, in accordance with embodiments of the present invention.

FIG. 2 is a flow chart showing a process 200 for manufacturing a ceramic coated article, in accordance with embodiments of the present invention. The operations of process 200 may be performed by various manufacturing machines, as set forth in FIG. 1.

At block 202, an article is provided. For example, the article can be a lid for a semiconductor manufacturing chamber that is formed of a conductive material, such as $Al_2O_3$. In another example, the article can be a showerhead for use in a semiconductor manufacturing chamber, such as a dielectric showerhead, which is formed of an anodized Al based bonded to a SiC faceplate. In yet another example, the article can be a chamber liner (e.g., a chamber liner kit for a semiconductor manufacturing chamber) formed of Al.

The article may be formed from a bulk ceramic such as $Y_2O_3$ (yttria), $Y_4Al_2O_9$ (YAM), $Al_2O_3$ (alumina), $Y_3Al_5O_{12}$ (YAG), Quartz, $YAlO_3$ (YAP), SiC (silicon carbide), $Si_3N_4$ (silicon nitride), AlN (aluminum nitride), $ZrO_2$ (zirconia), AlON (aluminum oxynitride), $TiO_2$ (titania), TiC (titanium carbide), ZrC (zirconium carbide), TiN (titanium nitride), TiCN (titanium carbon nitride), $Y_2O_3$ stabilized $ZrO_2$ (YSZ), and so on. Alternatively, the article may be formed of a metal such as aluminum, copper, magnesium, and so forth, which may or may not be anodized. The article may also be a ceramic composite such as an $Al_2O_3$—YAG ceramic composite or a SiC—$Si_3N_4$ ceramic composite. The article may also be a ceramic composite that includes a yttrium oxide (also known as yttria or $Y_2O_3$) containing solid solution. For example, the article may be a high performance material (HPM) that is composed of a compound $Y_4Al_2O_9$ (YAM) and a solid solution $Y_2$-$xZr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Gd_2O_3$, $Nd_2O_3$, $Nb_2O_5$, $CeO_2$, $Sm_2O_3$, $Yb_2O_3$, or other oxides. In one embodiment, the article is bulk $Al_2O_3$, which may have been formed based on ceramic sintering.

At block 204, the provided article is masked to cover portions or regions that will not be roughened. Any region that will not ultimately be coated with a ceramic coating may be masked. However, in one embodiment, a hard mask (e.g., a metal mask) is used to mask the region. In one embodiment, the article is not masked.

At block 206, the article is roughened by a bead blaster (or other ceramic roughener). In one embodiment, the bead blaster uses ceramic beads to blast a surface of the article. The ceramic beads may have a bead size of approximately 0.2-2 mm. In one embodiment, the ceramic beads have a size range of approximately 0.2-2 mm. The bead blaster may bead blast the article with an air pressure of approximately 30-90 psi and a working distance of approximately 50-150 mm, and the blasting angle to the body should be about or slightly less than 90 degree. The bead blaster may roughen exposed portions of the body of the article (those portions not covered by the mask).

In one embodiment, a processed article has a post-blast roughness of approximately 140-240 μin over a ceramic substrate and 120-180 μin over a metal substrate. Roughening the article to an optimal roughness may improve adhesion strength of a ceramic coating to the article. However, in one embodiment, the article is not roughened.

At block 208, the article is cleaned. The article be cleaned using one or more wet cleaners. Each wet cleaner may contain one or more wet baths with various liquids, such as deionized (DI) water and acetone. In one embodiment, a first wet cleaner executes a cleaning recipe that cleans the article for up to 10 minutes in a DI water bath, while ultrasonically agitating the DI water bath with a frequency and power of up to 100% (e.g., about 20 kW). In one embodiment, a second wet cleaner executes a cleaning recipe that cleans the article for up to 10 minutes in an acetone bath, while ultrasonically agitating the acetone bath with a frequency and power of up to 100% (e.g., about 20 kW). The article may then be cleaned with the first wet cleaner a second time using the same or different processing parameters. This may remove any residue caused by the acetone bath, and may further remove particles. In one embodiment, the article is cleaned by both wet cleaners multiple times. For example, the article may be cleaned in a DI bath, then in an acetone bath, then in the DI bath, then in the acetone bath, and then in the DI bath.

At block 212, the article is coated with a ceramic coating. A side of the article that will be exposed to a plasma environment may be coated. In one embodiment, a plasma sprayer is used to plasma spray the ceramic coating onto the article. In one embodiment, portions of the article that are not to be coated are masked prior to coating.

Mixed raw ceramic powders are sprayed onto the article. The article may be heated to a temperature of approximately 50-70° C. during the plasma spraying. In one embodiment, a plasma power of approximately 35-36.5 Watts (W) is used to plasma spray the article, though other plasma powers may also be used. The plasma spray process may be performed in multiple spray passes. In one embodiment, approximately 35-40 spray passes are applied to create a ceramic coating. In one example, the coating can have a thickness of approximately 5-50 mil.

In one embodiment, the ceramic coating is a yttrium oxide containing ceramic or other yttrium containing oxide that is deposited on the ceramic body using a thermal spraying technique (e.g., a plasma spraying technique). Thermal spraying techniques (e.g., plasma spraying techniques) may melt materials (e.g., ceramic powders) and spray the melted materials onto the article. The thermally sprayed or plasma sprayed ceramic coating may have a thickness about 20 micrometers (μm) to about several millimeters (mm). The ceramic coating may have structural properties that are different from those of bulk ceramic materials.

In one embodiment, the ceramic coating is produced from raw ceramic powders of $Y_2O_3$, $Al_2O_3$ and $ZrO_2$ that are mixed together. These raw ceramic powders may have a purity of 99.9% or greater in one embodiment. The raw ceramic powders may be mixed using, for example, ball milling. The raw ceramic powders may have a powder size of approximately 0.5-5 μm. In one embodiment, the raw ceramic powders have a powder size of approximately 1 μm. After the ceramic powders are mixed, they may be calcinated at a calcination temperature of approximately 1200-1600° C. (e.g., 1400° C. in one embodiment) and a calcination time of approximately 5-10 days (e.g., 3 days in one embodiment). The spray dried granular particle size for the mixed powder may have a size distribution of approximately 3-50 μm. In one embodiment, the median size is about 15 μm. In another embodiment, the median size is about 25 μm.

In one embodiment, the ceramic coating is formed of $Y_2O_3$ in a range between about 45 mol % and about 100 mol %, $ZrO_2$ in a range from about 0 mol % and about 55 mol %, and $Al_2O_3$ in a range from about 0 mol % to about 10 mol %. In one embodiment, the ceramic coating is formed of $Y_2O_3$ in a range between about 30 mol % and about 60 mol %, $ZrO_2$ in a range from about 0 mol % and about 20 mol %, and $Al_2O_3$ in a range from about 30 mol % to about 60 mol %.

For example, a ceramic coating CC1 can be formed of $Y_2O_3$ at about 37.5 mol % and $Al_2O_3$ at about 62.5 mol %. Another example ceramic coating CC2 can be formed of $Y_2O_3$ at about 53 mol %, $Al_2O_3$ at about 37 mol %, and $ZrO_2$ at about 10 mol %. In another example, a ceramic coating CC3 can be formed of $Y_2O_3$ at about 41 mol %, $Al_2O_3$ at about 47 mol %, and $ZrO_2$ at about 12 mol %. In yet another example, a ceramic coating CC4 can be formed of $Y_2O_3$ at about 73.13 mol % and $ZrO_2$ at about 26.87 mol %.

Table 1 shows characteristics of the ceramic coatings CC1, CC2, and CC3 in accordance with one embodiment.

TABLE 1

|  | CC1 | CC2 | CC3 |
|---|---|---|---|
| As-coated roughness (microinch) | 247-279 | 190-243 | 190-271 |
| HCl bubble time (hr) | 1/1.5 | 5.5/7 | 2/2 |
| Porosity (%) | 2.7 | 1.2 | 1.7 |
| Adhesion (MPa) | 32 | 28 | 27 |
| Hardness (GPa) | 6.3 | 6.4 | 6.4 |
| Break Down Voltage (V/mil) | 450 | 680 | 530 |
| X-Ray Diffraction (Tocalo data) | 100% Cubic minor amorphous | 100% Cubic minor amorphous | 60% Cubic, 40% monoclinic minor amorphous |
| Erosion rate under Producer $N_2/H_2$ Chemistry (nm/RFhr) | 21.50 | 15.83 | 21.00 |

Table 2 shows purity data for ceramic coatings CC1, CC2, CC3, CC4 including values for impurities in wt ppm, in accordance with one embodiment.

TABLE 2

|  | CC1 | CC2 | CC3 | CC4 |
|---|---|---|---|---|
| Ca | 5.9 | 4.2 | 5.1 | 5.1 |
| Cr | 0.56 | 0.5 | 1.5 | 0.24 |
| Cu | <0.2 | <0.2 | <0.2 | <0.2 |
| Fe | 2.5 | 2.1 | 6.5 | 1.1 |
| Mg | 1.9 | 0.68 | 1.7 | 1.4 |
| Mn | <0.1 | <0.1 | <0.1 | <0.1 |
| Ni | <0.1 | <0.1 | 1 | <0.1 |
| K | 1.2 | 0.76 | 0.71 | 3.1 |
| Na | 2 | 0.19 | 2.4 | 19 |
| Sr | <0.5 | <0.5 | <0.5 | <0.5 |
| Ti | 0.27 | 0.13 | 0.14 | 0.8 |
| Zn | <0.5 | <5 | <5 | <5 |

The ceramic coating may have a porosity of approximately 2-10% (e.g., less than approximately 5% in one embodiment), a hardness of approximately 3-8 gigapascals (GPa) (e.g., greater than approximately 4 GPa in one embodiment), and a thermal shock resistance of approximately 8-20 megapascals (MPa) (e.g., greater than approximately 10 MPa in one embodiment). Additionally, the ceramic coating may have an adhesion strength of approximately 4-20 MPa (e.g., greater than approximately 14 MPa in one embodiment). Adhesion strength may be determined by applying a force (e.g., measured in megapascals) to the ceramic coating until the ceramic coating peels off from the article.

In one embodiment, at block 212 the ceramic coating is trimmed. In one embodiment, edges of the ceramic coating are trimmed where the ceramic coating interfaces with the article. The ceramic coating may be ground at an angle (e.g., using an angle grinder) to chamfer the ceramic coating at the interfaces. The trimming may remove any ceramic coating from the non-roughened portions of the article. This may minimize peeling.

In one embodiment, at block 214 the ceramic coating is ground, lapped and/or polished. The grinding/polishing may reduce a thickness of the ceramic coating and/or reduce a roughness of the ceramic coating. The article (including the ceramic coating) may be used as a chamber component (e.g., a lid) in a chamber for a plasma etcher (also known as a plasma etch reactor) used to perform a conductor etch. By minimizing the surface roughness of the ceramic coated article, the exposed surface area will be reduced, leading to reduced on-wafer metal contamination. In one embodiment, the ceramic coating has a post-polish thickness of approximately 8-10 mil and a post-polish roughness of approximately 6-12 µin.

At block 216, the coated article is cleaned. The article may be cleaned using one or more wet cleaners. In one embodiment, a first wet cleaner executes a cleaning recipe that cleans the article for up to 10 minutes in a DI water bath, while ultrasonically agitating the DI water bath with a frequency and power of up to 100% (e.g., 20 kW). In one embodiment, a second wet cleaner executes a cleaning recipe that cleans the article for up to 10 minutes in an acetone bath, while ultrasonically agitating the acetone bath with a frequency and power of up to 100% (e.g., 20 kW). The article may then be cleaned with the first wet cleaner a second time.

After cleaning, the article may be tested for particles. Measured parameters that represent particle count are a tape peel test particle count and a liquid particle count (LPC). A tape test may be performed by attaching an adhesive tape to the ceramic coating, peeling the tape off, and counting a number of particles that adhere to the tape. The LPC may be determined by placing the article in a water bath (e.g., a de-ionized (DI) water bath) and sonicating the water bath. A number of particles that come off in the solution may then be counted using, for example, a laser counter.

Figure 3:
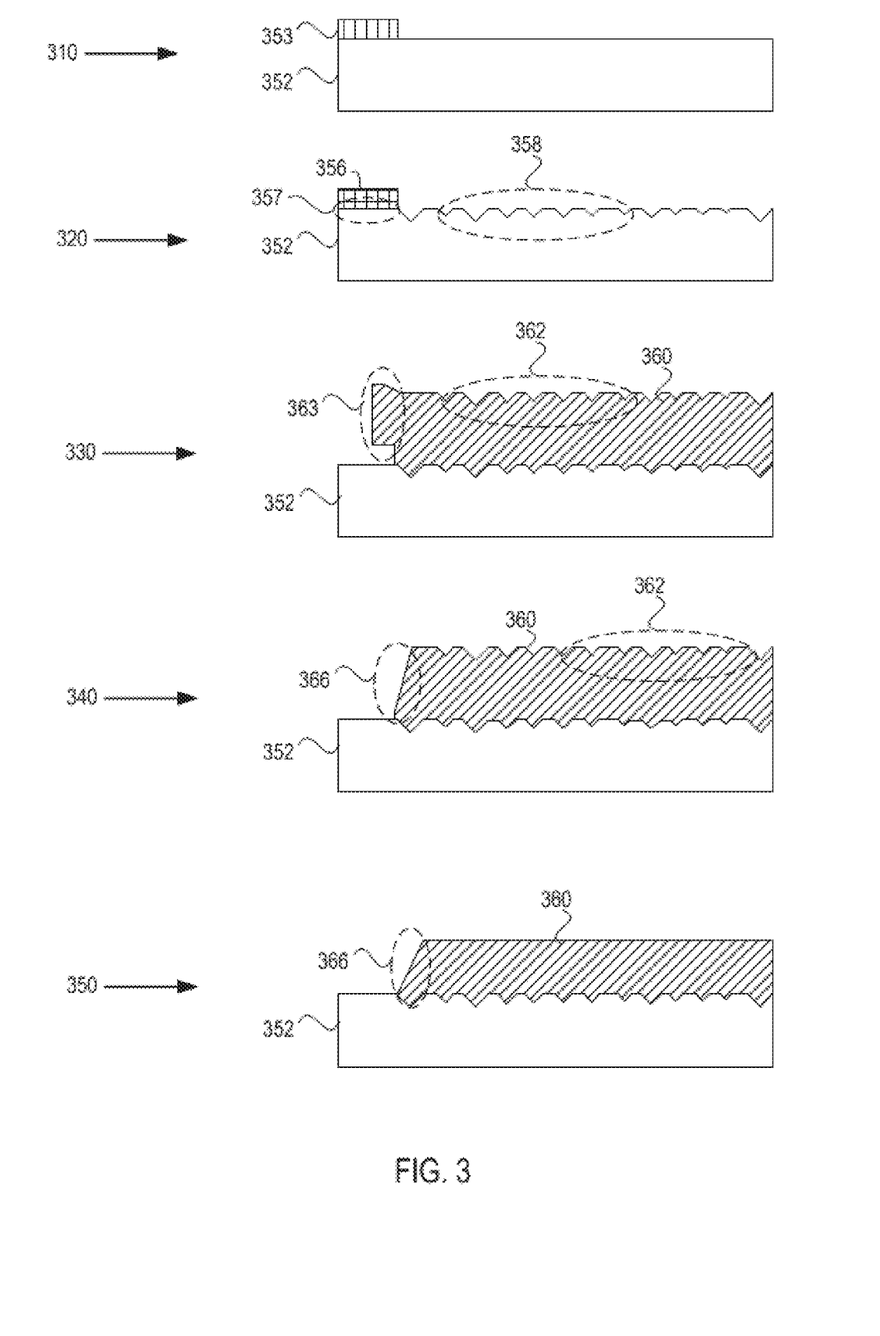
FIG. 3 shows cross-sectional side views of an article during different stages of a manufacturing process, in accordance with embodiments of the present invention

FIG. 3 shows cross sectional side views 310-350 of an article during different stages of a manufacturing process, in accordance with embodiments of the present invention. In one embodiment, the cross sectional side views correspond to a state of an article during different stages of manufacturing process 200.

Side view 310 shows a hard mask 353 disposed over a protected portion of a provided article. The provided article may have a metal body (e.g., an aluminum body) or a ceramic body (e.g., an Al$_2$O$_3$ body). Side view 310 shows a state of an article after completion of block 202 of method 200. The hard mask 353 may prevent the protected portion from becoming roughened during bead blasting.

Side view 320 shows the article 352 after bead blasting has been performed. The article 352 has a roughened surface 358, corresponding to a portion of the article that was not protected during the bead blasting. The article 352 additionally has a smooth surface 357 corresponding to a portion of the article that has not been roughened. As shown, a soft mask 356 is disposed on the article 352 over the smooth surface 357 after the article 352 has been roughened. The soft mask 356 may be used to cover a same region of the article 352 that was previously protected by the hard mask 353. Side view 320 shows a state of the article after completion of block 212.

Side view 330 shows a ceramic coating 360, e.g., according to one of the embodiments described herein, over article 352. As shown, the ceramic coating 360 has a rough surface 362. This rough surface may be a source of particle contamination when the ceramic article is used in processing. Additionally, if the article may be used as a lid in a plasma etcher that performs a conductor etch, the rough surface 362 may cause sputtering to occur (e.g., due to inductive coupling). Additionally, the ceramic coating may have a lip 363 and/or rough edges where the soft mask 356 had been. This lip 363 may cause the ceramic coating 360 to peel away from the article 352 during processing. Additionally, this lip may be a source of particle contamination. Side view 330 shows a state of the article after completion of block 215.

Side view 340 shows the ceramic coating 360 over the article 352 after edges of the ceramic coating 360 have been trimmed. Side view 340 shows a state of the article after completion of block 220. As shown, the ceramic coating 360 now has a tapered or chamfered edge 366.

Side view 350 shows the ceramic coating 360 over the article 352 after the ceramic coating 360 has been ground and polished. Side view 350 shows a state of the article after completion of block 222. As shown, the rough surface 362 of the ceramic coating 360 has been smoothed, and a thickness of the ceramic coating 360 has been reduced.

Figure 4:
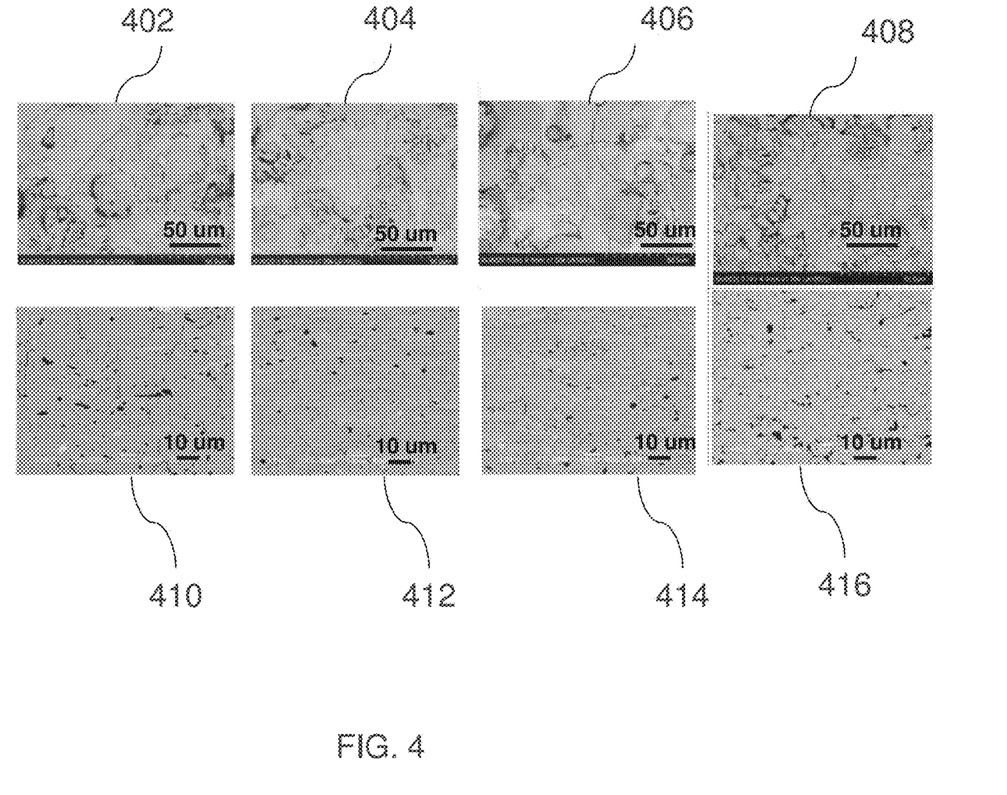
FIG. 4 shows top-down and cross-sectional micrograph views of coatings, in accordance with embodiments of the present invention.

FIG. 4 shows micrographs of sample of articles with ceramic coatings, in accordance with embodiments of the present invention. Micrograph 402 illustrates a surface of ceramic coating CC1, micrograph 404 illustrates a surface of ceramic coating CC2, micrograph 406 illustrates a surface of ceramic coating CC3, and micrograph 408 illustrates a surface of ceramic coating CC4. Micrograph 410 shows a sample of the cross-section of ceramic coating CC1, micrograph 412 shows a sample of the cross-section of ceramic coating CC2, micrograph 414 shows a sample of the cross-section of ceramic coating CC3, and micrograph 415 shows a sample of the cross-section of ceramic coating CC4.

Figure 5:
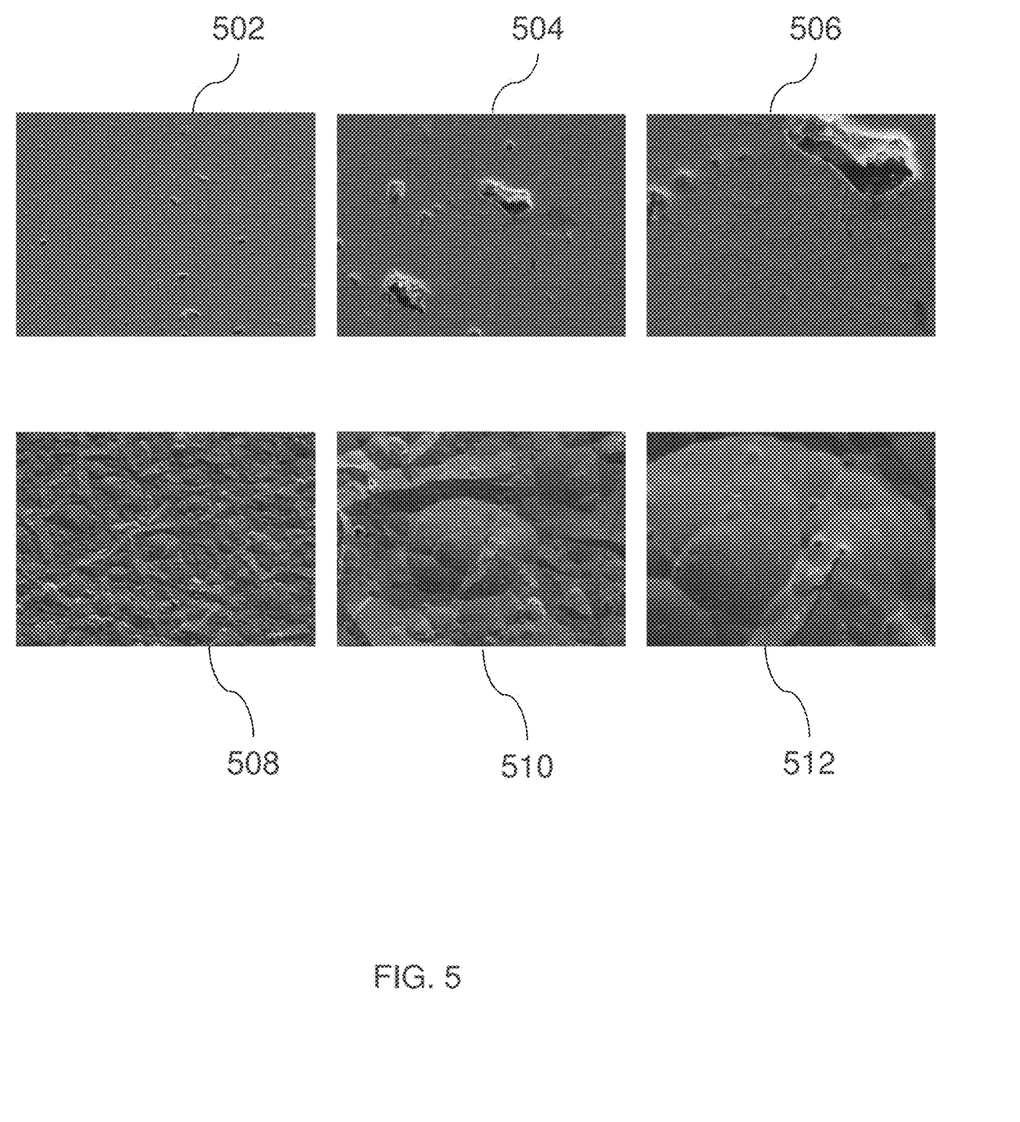
FIG. 5 shows micrographs of a ceramic coating's surface at various magnification levels, in accordance with embodiments of the present invention.

FIG. 5 shows additional micrographs 502-512 of a surface of a ceramic coating CC1 on an article at various magnification levels before the ceramic coating is utilized, and after the ceramic coating has been utilized such that erosion occurs, in accordance with embodiments of the present invention. Micrograph 502 illustrates ceramic coating CC1 at a 1,000-fold magnification before the article has been utilized. Micrograph 504 illustrates ceramic coating CC1 at a 4,000-fold magnification before the article has been utilized. Micrograph 506 illustrates ceramic coating CC1 at a 10,000-fold magnification before the article has been utilized.

Micrograph 508 illustrates ceramic coating CC1 at a 1,000-fold magnification after the article has been utilized such that erosion occurs. Micrograph 510 illustrates ceramic coating CC1 at a 4,000-fold magnification after the article has been utilized such that erosion occurs. Micrograph 512 illustrates ceramic coating CC1 at a 10,000-fold magnification after the article has been utilized such that erosion occurs.

Figure 6:
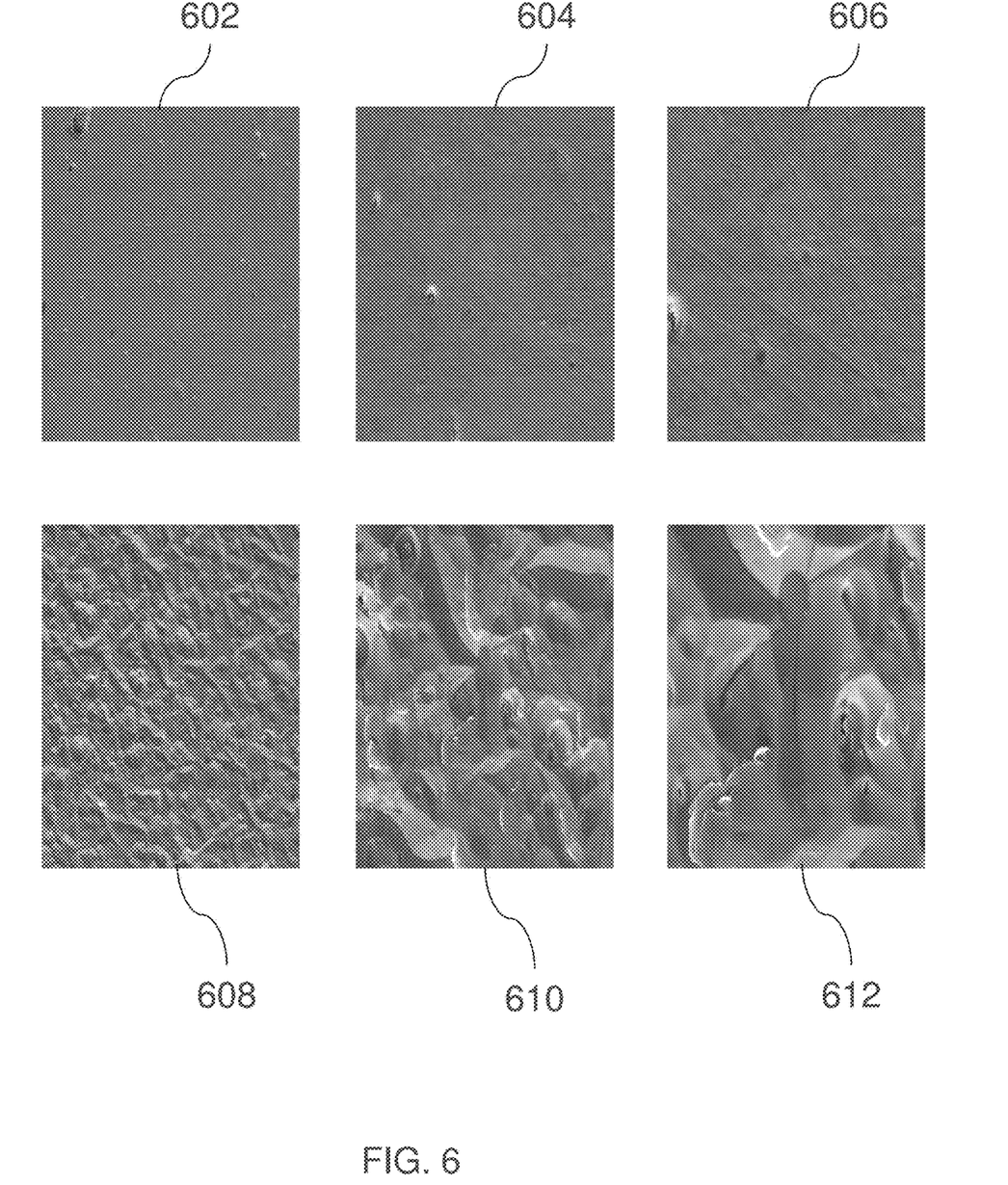
FIG. 6 shows micrographs of a ceramic coating's surface at various magnification levels, in accordance with embodiments of the present invention.

FIG. 6 shows additional micrographs 602-612 of a surface of a ceramic coating CC2 on an article at various magnification levels before the ceramic coating is utilized, and after the ceramic coating has been utilized such that erosion occurs, in accordance with embodiments of the present invention. Micrograph 602 illustrates ceramic coating CC2 at a 1,000-fold magnification before the article has been utilized. Micrograph 604 illustrates ceramic coating CC2 at a 4,000-fold magnification before the article has been utilized. Micrograph 606 illustrates ceramic coating CC2 at a 10,000-fold magnification before the article has been utilized.

Micrograph 608 illustrates ceramic coating CC2 at a 1,000-fold magnification after the article has been utilized such that erosion occurs. Micrograph 610 illustrates ceramic coating CC2 at a 4,000-fold magnification after the article has been utilized such that erosion occurs. Micrograph 612 illustrates ceramic coating CC2 at a 10,000-fold magnification after the article has been utilized such that erosion occurs.

Figure 7:
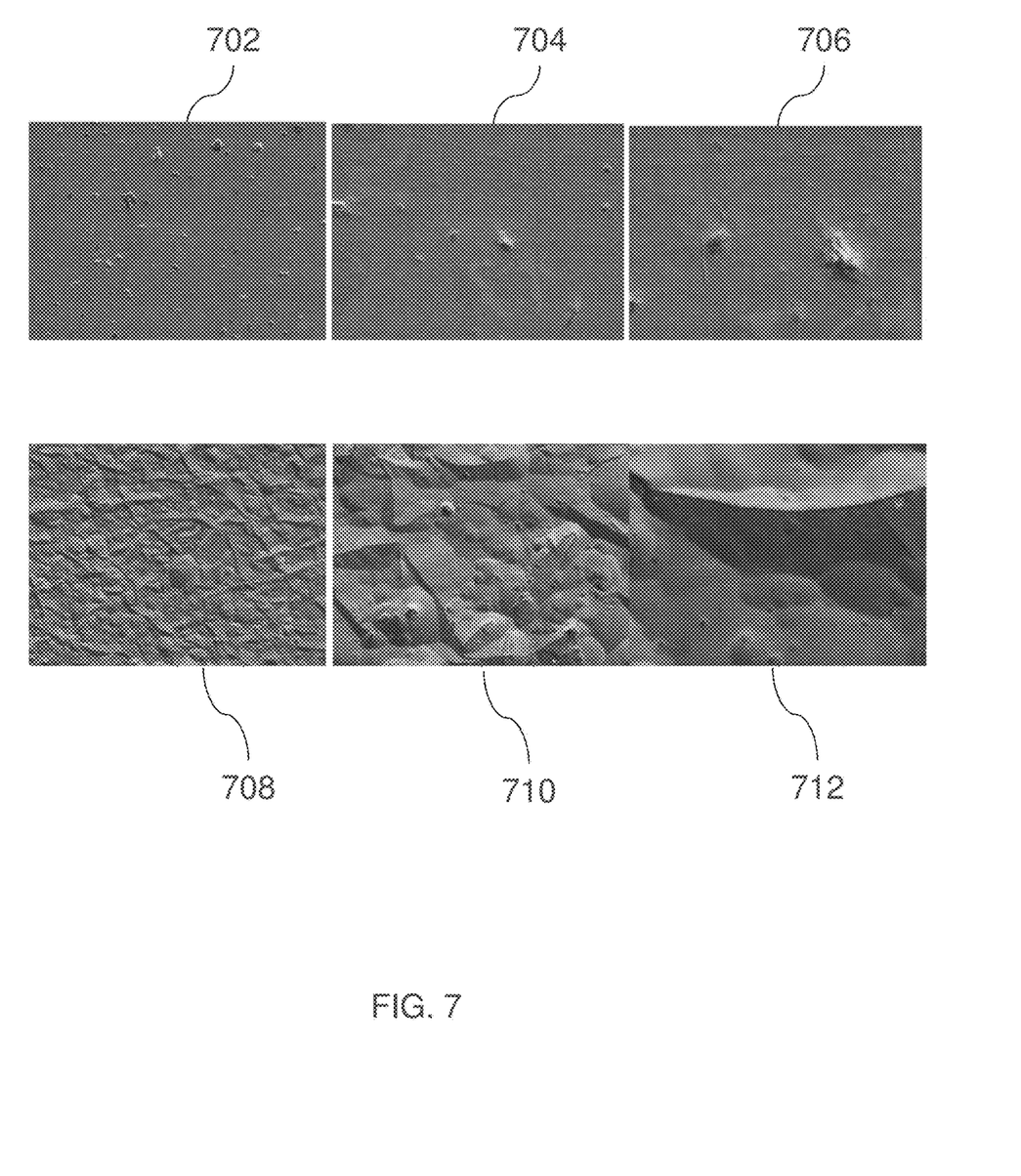
FIG. 7 shows micrographs of a ceramic coating's surface at various magnification levels, in accordance with embodiments of the present invention.

FIG. 7 shows additional micrographs 702-712 of a surface of a ceramic coating CC3 on an article at various magnification levels before the ceramic coating is utilized, and after the ceramic coating has been utilized such that erosion occurs, in accordance with embodiments of the present invention. Micrograph 702 illustrates ceramic coating CC3 at a 1,000-fold magnification before the article has been utilized. Micrograph 704 illustrates ceramic coating CC3 at a 4,000-fold magnification before the article has been utilized. Micrograph 706 illustrates ceramic coating CC3 at a 10,000-fold magnification before the article has been utilized.

Micrograph 708 illustrates ceramic coating CC3 at a 1,000-fold magnification after the article has been utilized such that erosion occurs. Micrograph 710 illustrates ceramic coating CC3 at a 4,000-fold magnification after the article has been utilized such that erosion occurs. Micrograph 712 illustrates ceramic coating CC3 at a 10,000-fold magnification after the article has been utilized such that erosion occurs.

Figure 8:
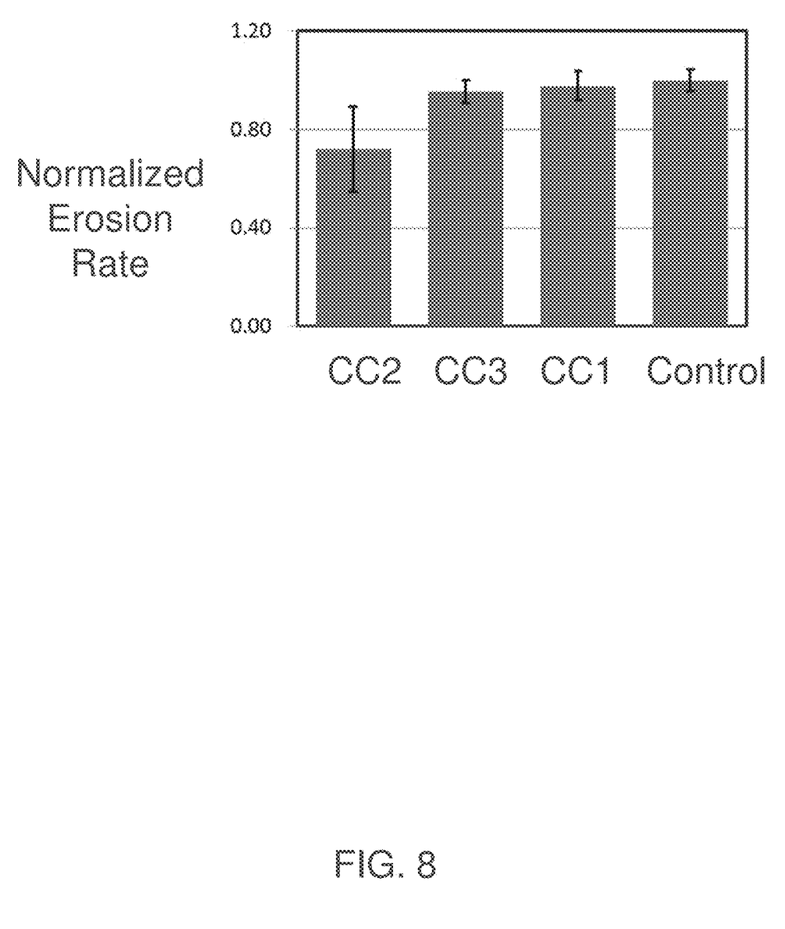
FIG. 8 shows normalized erosion rates of ceramic coatings, in accordance with embodiments of the present invention.

FIG. 8 shows normalized erosion rates for CC1, CC2, CC3, and a control, where CC2 demonstrates the lowest normalized erosion rate.

Table 3 shows erosion rate comparisons for ceramic coatings CC1, CC2, and CC3, and a control ceramic coating, where CC2 generally shows lower erosion rates.

TABLE 3

|  | $N_2/H_2$ | $CH_3/CF_4$ | $CH_4/Cl_2$ |
|---|---|---|---|
| Control | 22.00 | 0.35 | 0.18 |
| CC1 | 21.5 | 0.45 | 0.35 |
| CC2 | 15.83 | 0.35 | 0.25 |
| CC3 | 21.00 | 0.43 | 0.24 |

The ceramic coatings described herein provide high erosion resistance under H2 chemistry, low porosity, and significant improvement in corrosion resistance (e.g., HCl bubble time), reduced surface roughness of the coating, and increased breakdown voltage, as compared to other ceramic coatings.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A component for a processing chamber comprising:
a body of the component for the processing chamber, the body comprising an approximately planar surface area comprising an unroughened surface region and a roughened surface region on the approximately planar surface area, the roughened surface region having a first surface roughness of about 120-240 µin and the unroughened surface region having a second surface roughness that is lower than the first surface roughness; and
a plasma resistant ceramic coating on the roughened surface region of the approximately planar surface area of the body and not on the unroughened surface region of the approximately planar surface area of the body, wherein the plasma resistant ceramic coating is a plasma sprayed coating that consists essentially of $Y_2O_3$ in a range between about 45 mol % to about 73 mol % and $ZrO_2$ in a range from about 27 mol % to about 55 mol %,
the plasma resistant ceramic coating comprising a post-polished surface roughness of about 6 µm to about 12 µm and a post-polished thickness of about 5 mil to about 25 mil,
wherein the plasma resistant ceramic coating comprises at least one of a tapered edge or a chamfered edge at an interface between the roughened surface region and the unroughened surface region.

2. The component of claim 1, wherein the plasma resistant ceramic coating consists essentially of about 73 mol % of $Y_2O_3$ and about 27 mol % of $ZrO_2$.

3. The component of claim 1, wherein the body comprises at least one of aluminum, copper, or magnesium, and wherein the roughened surface region of the body has a surface roughness of approximately 120-180 µin.

4. The component of claim 1, wherein the body comprises a ceramic.

5. The component of claim 1, wherein the plasma resistant ceramic coating has a porosity of less than about 5%, a hardness of greater than about 4 GPa, a thermal shock resistance of greater than about 10 MPa, and an adhesion strength of greater than about 14 MPa.

6. The component of claim 1, wherein the plasma resistant ceramic coating is a plasma sprayed coating having a post-polished thickness of about 8 mil to about 10 mil.

7. The component of claim 1, wherein the plasma resistant ceramic coating consists essentially of 73.1 mol % of $Y_2O_3$ and 26.9 mol % of $ZrO_2$.

8. The component of claim 1, wherein the body comprises a ceramic selected from a group consisting of $Y_2O_3$ (yttria), $Y_4Al_2O_9$ (YAM), $Al_2O_3$ (alumina), $Y_3Al_5O_{12}$ (YAG), Quartz, $YAlO_3$ (YAP), SiC (silicon carbide), $Si_3N_4$ (silicon nitride), AlN (aluminum nitride), $ZrO_2$ (zirconia), $Al_2O_3$ (alumina), AlON (aluminum oxynitride), $TiO_2$ (titania), TiC (titanium carbide), ZrC (zirconium carbide), TiN (titanium nitride), TiCN (titanium carbon nitride), and $Y_2O_3$ stabilized $ZrO_2$ (YSZ).

9. The component of claim 1, wherein the plasma resistant ceramic coating is usable at operating temperatures of up to approximately 150° C.

10. The component of claim 1, wherein the plasma resistant ceramic coating has impurities of less than or equal to 5.1 parts per million (ppm) of Ca, 0.24 ppm of Cr, 0.2 ppm of Cu, 1.1 ppm of Fe, 1.4 ppm of Mg, 0.1 ppm of Mn, 0.1 ppm of Ni, 3.1 ppm of K, 19 ppm of Na, 0.5 ppm of Sr, 0.8 ppm of Ti and or 5 ppm of Zn.

11. The component of claim 2, wherein in the plasma resistant ceramic coating has impurities of Ca, Cr, Fe, Mg, K, Na or Ti.

12. The component of claim 2, wherein the plasma resistant ceramic coating has at least one of an impurity of about 0.24 ppm of Cr or an impurity of about 1.1 ppm of Fe.

13. The component of claim 1, wherein the plasma resistant ceramic coating has impurities of at least one of 5.1 parts per million (ppm) of Ca, 0.24 ppm of Cr, less than 0.2 ppm of Cu, 1.1 ppm of Fe, 1.4 ppm of Mg, less than 0.1 ppm of Mn, less than 0.1 ppm of Ni, 3.1 ppm of K, 19 ppm of Na, less than 0.5 ppm of Sr, 0.8 ppm of Ti and or less than 5 ppm of Zn.

14. The component of claim 1, wherein the body comprises $Al_2O_3$.

15. The component of claim 1, wherein the body comprises a yttrium oxide containing solid solution.

16. The component of claim 1, wherein the component comprising the plasma resistant ceramic coating has a lifespan of at least about 2 years of usage in a plasma environment.

17. The component of claim 1, wherein the plasma resistant ceramic coating has an adhesion strength of about 4 MPa to about 20 MPa.

18. The component of claim 1, wherein the processing chamber is a plasma etch reactor and the component is a ceramic lid of the plasma etch reactor.

19. The component of claim 1, wherein the post-polish thickness is less than an unpolished thickness.

20. The component of claim 19, wherein the plasma resistant ceramic coating has a post-polished thickness of about 8 mil to about 12 mil.

* * * * *